(12) United States Patent
Kadobe et al.

(10) Patent No.: US 11,302,542 B2
(45) Date of Patent: Apr. 12, 2022

(54) PROCESSING APPARATUS

(71) Applicant: TOKYO ELECTRON LIMITED, Tokyo (JP)

(72) Inventors: Masato Kadobe, Oshu (JP); Shinya Nasukawa, Oshu (JP); Hiromi Nitadori, Oshu (JP); Kazuyuki Kikuchi, Oshu (JP); Hirofumi Kaneko, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 8 days.

(21) Appl. No.: 16/737,512

(22) Filed: Jan. 8, 2020

(65) Prior Publication Data

US 2020/0227293 A1 Jul. 16, 2020

(30) Foreign Application Priority Data

Jan. 10, 2019 (JP) .............................. JP2019-002945
Oct. 18, 2019 (JP) .............................. JP2019-191462

(51) Int. Cl.
| | |
|---|---|
| *H01L 21/67* | (2006.01) |
| *H01L 21/677* | (2006.01) |
| *F27D 5/00* | (2006.01) |
| *F27D 7/06* | (2006.01) |
| *F27D 9/00* | (2006.01) |
| *F27D 3/00* | (2006.01) |

(52) U.S. Cl.
CPC ...... *H01L 21/67173* (2013.01); *F27D 3/0084* (2013.01); *F27D 5/0037* (2013.01); *F27D 7/06* (2013.01); *F27D 9/00* (2013.01); *H01L 21/67017* (2013.01); *H01L 21/67098* (2013.01); *H01L 21/67757* (2013.01); *F27D 2003/0085* (2013.01); *F27D 2009/007* (2013.01)

(58) Field of Classification Search
CPC ................................................. H01L 21/67173
See application file for complete search history.

(56) References Cited

U.S. PATENT DOCUMENTS

| | | | |
|---|---|---|---|
| 2006/0185592 A1* | 8/2006 | Matsuura | H01L 21/31116 118/715 |
| 2015/0147873 A1* | 5/2015 | Moriya | H01L 21/0262 438/492 |
| 2018/0286716 A1* | 10/2018 | Sakata | H01L 21/68707 |
| 2019/0198359 A1* | 6/2019 | Kamimura | H01L 21/02 |
| 2019/0371633 A1* | 12/2019 | Takano | H01L 21/67178 |

FOREIGN PATENT DOCUMENTS

| | | |
|---|---|---|
| JP | 2001-156009 A | 6/2001 |
| JP | 2002-170781 A | 6/2002 |
| JP | 2003-31562 A | 1/2003 |

\* cited by examiner

*Primary Examiner* — Nathaniel Herzfeld
(74) *Attorney, Agent, or Firm* — Nath, Goldberg & Meyer; Jerald L. Meyer; Tanya E. Harkins

(57) ABSTRACT

A processing apparatus includes: a plurality of process modules concatenated with one another; and a loader module configured to receive a carrier accommodating a plurality of substrates to be processed by the plurality of process modules, wherein each of the plurality of process modules includes: a heat treatment unit including a processing container configured to accommodate the plurality of substrates and perform a heat treatment on the plurality of substrates; and a gas supply unit disposed on one side surface of the heat treatment unit and configured to supply a gas into the processing container.

10 Claims, 7 Drawing Sheets

PROCESSING APPARATUS

CROSS-REFERENCE TO RELATED APPLICATIONS

This application is based upon and claims the benefit of priority from Japanese Patent Application No. 2019-002945, filed on Jan. 10, 2019, and Japanese Patent Application No. 2019-191462, filed on Oct. 18, 2019, the entire contents of which are incorporated herein by reference.

TECHNICAL FIELD

The present disclosure relates to a processing apparatus.

BACKGROUND

There is a processing apparatus in which a gas supply box is disposed on a rear surface or a side surface of a processing container (see, for example, Patent Documents 1 to 3).

PRIOR ART DOCUMENTS

Patent Documents

Patent Document 1: Japanese laid-open publication No. 2001-156009
Patent Document 2: Japanese laid-open publication No. 2002-170781
Patent Document 3: Japanese laid-open publication No. 2003-31562

SUMMARY

An aspect of the present disclosure provides a processing apparatus including: a plurality of process modules concatenated with one another; and a loader module configured to receive a carrier accommodating a plurality of substrates to be processed by the plurality of process modules. Each of the plurality of process modules includes: a heat treatment unit including a processing container configured to accommodate the plurality of substrates and perform a heat treatment on the plurality of substrates; and a gas supply unit disposed on one side surface of the heat treatment unit and configured to supply a gas into the processing container.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
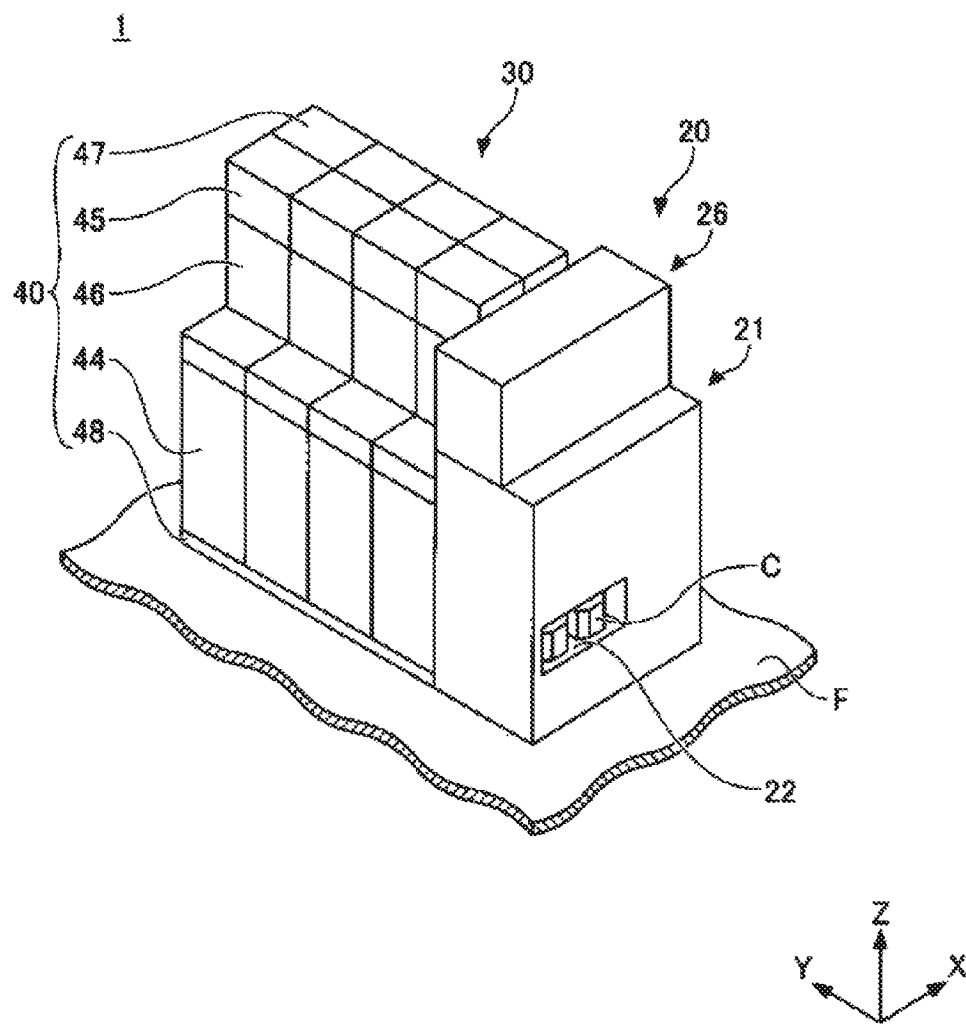
FIG. 1 is a perspective view illustrating an example of a configuration of a processing apparatus according to a first embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, non-limiting exemplary embodiments of the present disclosure will be described with reference to the accompanying drawings. In all the accompanying drawings, the same or corresponding members or components will be denoted by the same or corresponding reference numerals, and redundant explanations will be omitted.

First Embodiment

Figure 2:
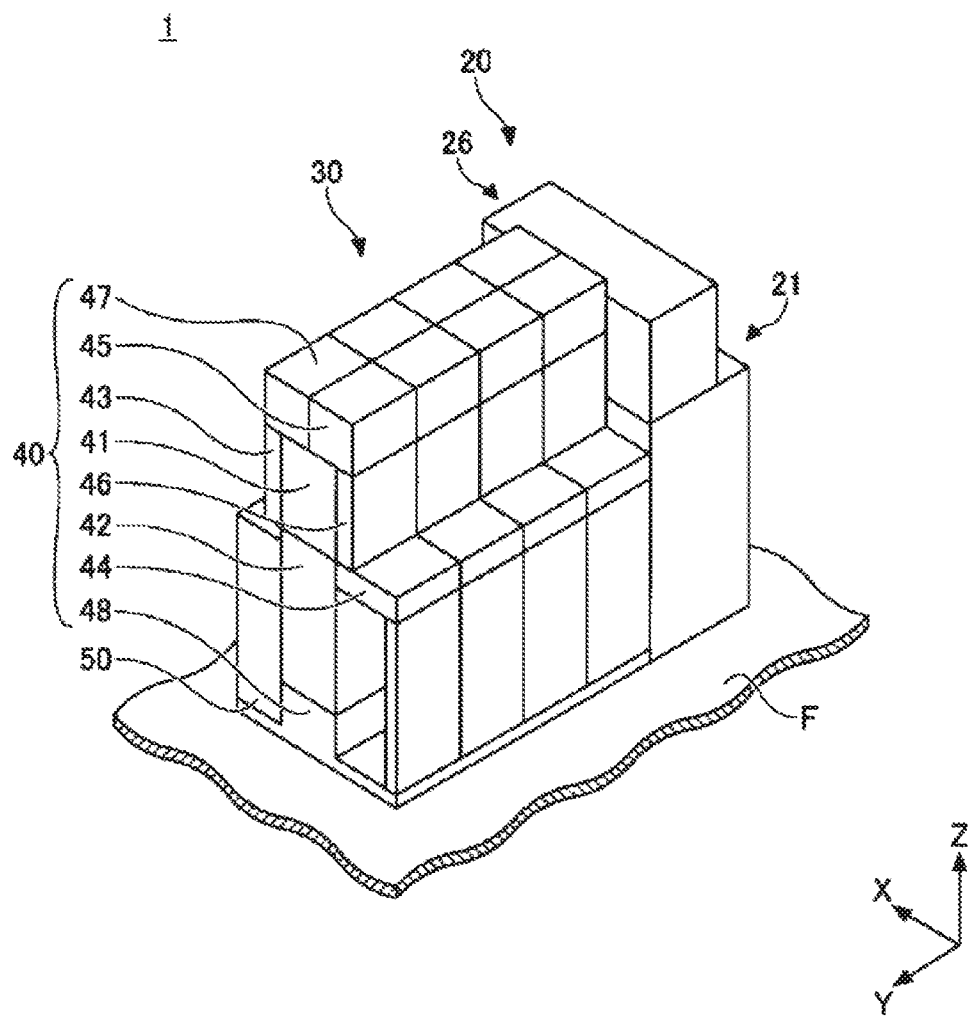
FIG. 2 is a perspective view illustrating an example of a configuration of the processing apparatus according to the first embodiment of the present disclosure.
Figure 3:
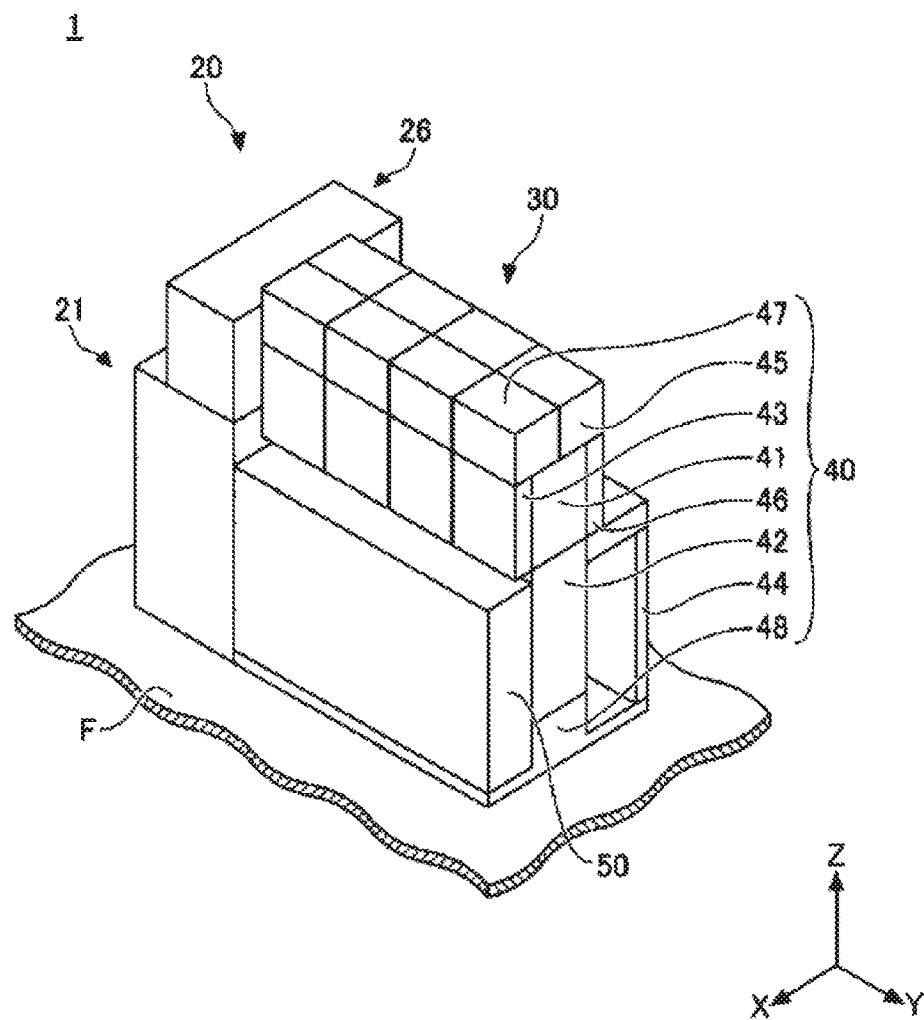
FIG. 3 is a perspective view illustrating an example of a configuration of the processing apparatus according to the first embodiment of the present disclosure.
Figure 4:
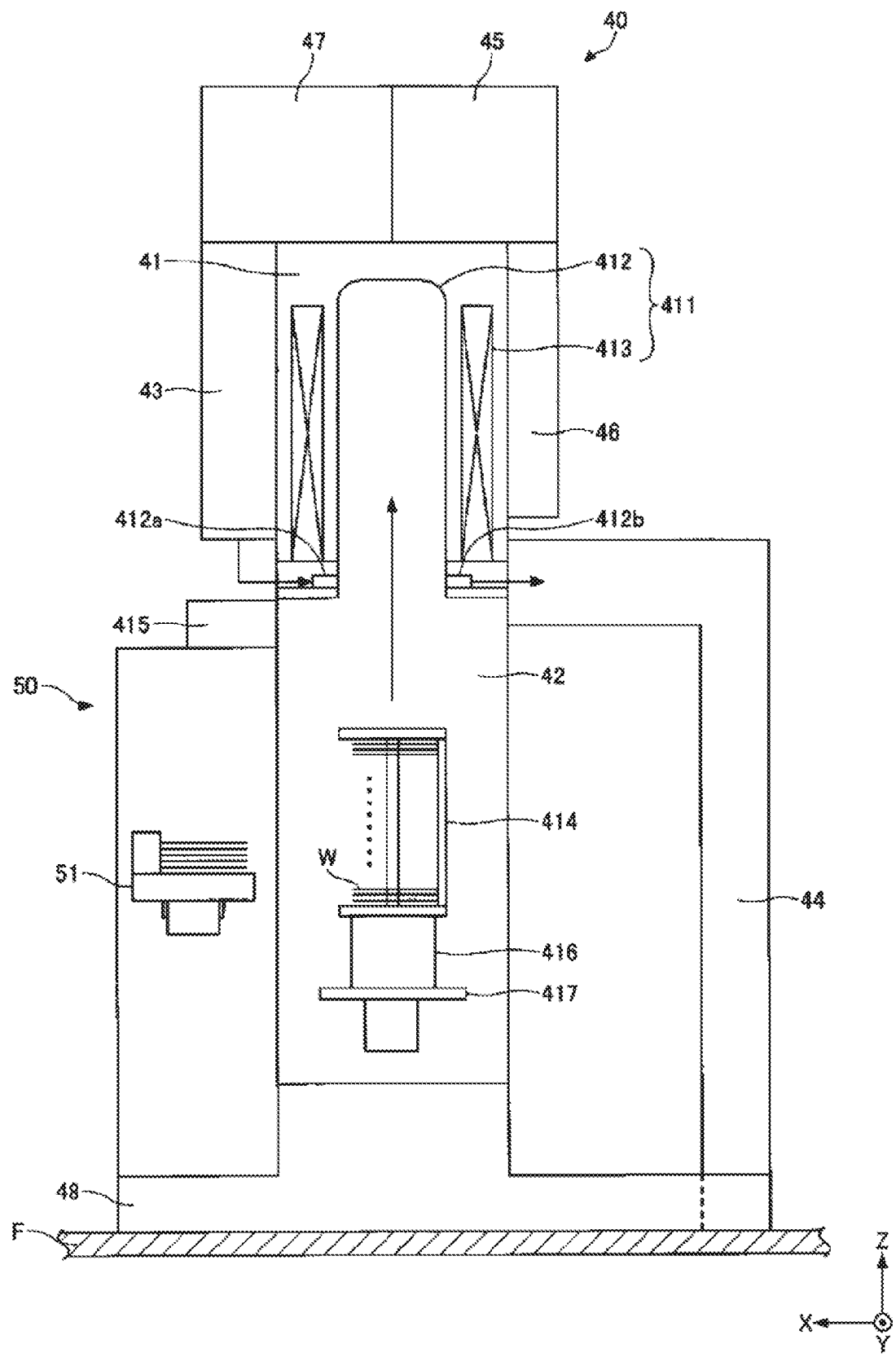
FIG. 4 is a side view of the processing apparatus of FIGS. 1 to 3.

A processing apparatus according to a first embodiment will be described. FIGS. 1 to 3 are perspective views illustrating an example of a configuration of the processing apparatus according to the first embodiment, and are views obtained when the processing apparatus is viewed from perspectives different from one another. FIG. 4 is a side view of the processing apparatus of FIGS. 1 to 3. In the following description, an X direction, a Y direction, and a Z direction denote the left-right direction, the front-rear direction, and the height direction of the processing apparatus, respectively.

As illustrated in FIGS. 1 to 4, the processing apparatus 1 includes a loader module 20 and a processing module 30.

The interior of the loader module 20 is maintained in an air atmosphere, for example. The loader module 20 is a region via which a carrier C accommodating a semiconductor wafer (hereinafter, referred to as "wafer W") as an example of a substrate is transferred among elements in the processing apparatus 1 to be described later, and via which the wafer W is loaded into the processing apparatus 1 from outside and unloaded from the processing apparatus 1 to the outside. The carrier C may be, for example, a front opening unified pod (FOUP). The loader module 20 includes a first transfer part 21 and a second transfer part 26 located at a rear side of the first transfer part 21.

In the first transfer part 21, for example, two load ports 22 are provided side-by-side in the left-right direction. The load ports 22 are loading stages configured to receive the carrier C when the carrier C is loaded into the processing apparatus 1. The load ports 22 are provided at locations where a wall of a housing is opened so as to allow an access from the outside to the processing apparatus 1. One or more stockers (not illustrated) configured to store the carrier C is provided in the first transfer part 21.

The second transfer part 26 is provided with front opening interface mechanical standard (FIMS) ports (not illustrated). For example, two FIMS ports are provided side-by-side in the height direction. The FIMS ports are holders configured to hold the carrier C when the wafer W accommodated in the carrier C is loaded into and unloaded from a heat treatment furnace 411 in the processing module 30 to be described later. The FIMS ports are movable in the front-rear direction. Like the first transfer part 21, one or more stockers (not illustrated) configured to store the carrier C is provided in the second transfer part 26.

A carrier transfer mechanism (not illustrated) configured to transfer the carrier C among the load ports 22, the stockers, and the FIMS ports are provided between the first transfer part 21 and the second transfer part 26.

The processing module 30 takes out the wafer W from the carrier C and performs various processes on the wafer W. In order to prevent an oxide film from being formed on the wafer W, the interior of the processing module 30 is maintained under an inert gas atmosphere, for example, a nitrogen gas atmosphere. The processing module 30 has four process modules 40 and a wafer transfer module 50.

The process modules 40 are concatenated with one another in the front-rear direction. Each of the process modules 40 includes a heat treatment unit 41, a load unit 42, a gas supply unit 43, an exhaust duct 44, a rapid cooling unit (RCU) 45, a branch duct 46, a control unit 47, and a floor box 48.

The heat treatment unit 41 receives a plurality (e.g., 25 to 150 sheets) of waters W and performs a predetermined heat treatment on the wafers W. The heat treatment unit 41 includes the heat treatment furnace 411.

The heat treatment furnace 411 includes a processing container 412 and a heater 413.

The processing container 412 accommodates a wafer boat 414, which is an example of a substrate holder. The wafer boat 414 has a cylindrical shape and is formed of quartz, for example, and holds the wafers W in multiple stages. A gas introduction port 412a and an exhaust port 412b are provided in the processing container 412.

The gas introduction port 412a is configured to introduce a gas into the processing container 412. The gas introduction port 412a may be arranged at a side of the gas supply unit 43. With this configuration, it may be possible to shorten a length of a pipe between the gas supply unit 43 and the gas introduction port 412a, which results in advantageous effects such as reduction in the number of pipe members or pipe heaters, reduction in power consumption by the pipe heaters, reduction in a purge region at the time of maintenance, and reduction in a risk of introducing impurities into the processing container 412. In addition, an installation position of the gas introduction port 412a may be the same among the plurality of process modules 40. With this configuration, it may be possible to make the length of the pipe between the gas supply unit 43 and the gas introduction port 412a uniform among the plurality of process modules 40, which reduces process variation due to machine differences.

The exhaust port 412b is configured to exhaust a gas from the processing container 412. The exhaust port 412b may be disposed at a side of the exhaust duct 44. With this configuration, the gas introduction port 412a and the exhaust port 412b face each other with the processing container 412 interposed therebetween, which simplifies a gas flow in the processing container 412. In addition, since the gas introduction port 412a and the exhaust port 412b are separated from each other, it is possible to secure sufficient installation positions when a plurality of gas introduction ports 412a is provided in the processing container 412. In addition, the installation position of the exhaust port 412b may be the same among the plurality of process modules 40. With this configuration, it may be possible to make the exhaust conductance uniform among the plurality of process modules 40, which reduces process variation due to machine differences.

The heater 413 surrounds the processing container 412 and may have, for example, a cylindrical shape. The heater 413 heats the wafers W accommodated in the processing container 412. A shutter 415 is provided below the processing container 412. The shutter 415 is a door configured to close a lower end of the heat treatment furnace 411 by a lid during a period after the wafer boat 414 is unloaded from the heat treatment furnace 411 and before a subsequent wafer boat 414 is loaded into the heat treatment furnace 411.

The load unit 42 is disposed below the heat treatment unit 41, and is installed on a floor F via the floor box 48. In the load unit 42, the wafer boat 414 is placed on a lid 417 via a heat insulation tube 416. The wafer boat 414 is formed of a heat-resistant material such as quartz or silicon carbide, and holds the wafers W in a substantially horizontal position at predetermined intervals in the vertical direction. The lid 417 is supported by an elevation mechanism (not illustrated), and the wafer boat 414 is loaded into and unloaded from the processing container 412 by the elevation mechanism. The load unit 42 also functions as a space for cooling the wafers W processed in the heat treatment unit 41.

The gas supply unit 43 is disposed on a side surface of the heat treatment unit 41 while being spaced apart from the floor F. The gas supply unit 43 overlaps, for example, the wafer transfer module 50 in a plan view. The gas supply unit 43 includes a pressure adjustor, a mass flow controller, a valve, and the like, which are configured to supply a processing gas or a purge gas into the processing container 412 at a desired flow rate.

The exhaust duct 44 faces the gas supply unit 43 with the heat treatment unit 41 interposed therebetween. The exhaust duct 44 includes an exhaust pipe connecting the interior of the processing container 412 and a vacuum pump (not illustrated), a pipe heater configured to heat the exhaust pipe, and the like.

The RCU 45 is disposed on a ceiling of the heat treatment unit 41. The RCU 45 is configured to generate a coolant to be supplied to the branch duct 46, and includes a heat exchanger, a blower, a valve, a pipe, and the like.

The branch duct 46 is provided on the side surface of the heat treatment unit 41 at a location, for example, facing the gas supply unit 43 with the heat treatment unit 41 interposed therebetween. The branch duct 46 diverts the coolant supplied from the RCU 45 toward a space between the processing container 412 and the heater 413. Thus, it may be possible to cool the processing container 412 within a short time.

The control unit 47 is disposed on the ceiling of the heat treatment unit 41. The control unit 47 includes a control device configured to control operations of respective components of the process module 40. For example, the control device controls the operation of the gas supply unit 43 to adjust the flow rate of the processing gas or the purge gas supplied into the processing container 412.

The wafer transfer module 50 is an example of a substrate transfer module, and a single wafer transfer module 50 is provided in common for the plurality of process modules 40. In other words, the plurality of process modules 40 has a common water transfer module 50. The wafer transfer module 50 is disposed over one side surface of the plurality of process modules 40, and is installed on the floor F via the floor box 48. A wafer transfer mechanism 51, which is an example of a substrate transfer mechanism, is provided in the wafer transfer module 50. The wafer transfer mechanism 51 delivers the wafers W between the interior of the carrier C placed on the FIMS port and the wafer boat 414 placed on the load unit 42 of the process module 40. The wafer transfer mechanism 51 has, for example, a plurality of forks to simultaneously transfer the plurality of wafers W. Thus, it may be possible to shorten a time required to transfer the wafers W. Alternatively, the wafer transfer mechanism 51 may have one fork.

As described above, in the processing apparatus 1, a plurality of process modules 40 is provided for one loader module 20. Thus, it may be possible to reduce an installation area of the processing apparatus 1 compared with a case in which one process module 40 is provided for one loader module 20. Therefore, productivity per unit area is improved.

As described above, according to the processing apparatus 1 of the first embodiment, a plurality of process modules 40 are concatenated with one another for one loader module 20. Each of the plurality of process modules 40 includes the heat treatment unit 41 having the processing container 412 configured to accommodate and process a plurality of wafers W, and the gas supply unit 43 disposed on one side surface of the heat treatment unit 41 and configured to supply a gas into the processing container 412. Thus, it may be possible to reduce a footprint of the processing apparatus 1 having a plurality of process modules 40. In addition, it is possible to easily perform maintenance of the process modules 40. Specifically, since a space is secured above the wafer transfer module 50, it is possible to easily perform maintenance of the gas supply unit 43 from a side of the wafer transfer module 50. In addition, since a relatively large space can be secured at a side of the exhaust duct 44, it is possible to easily perform maintenance of the heat treatment unit 41.

Figure 5:
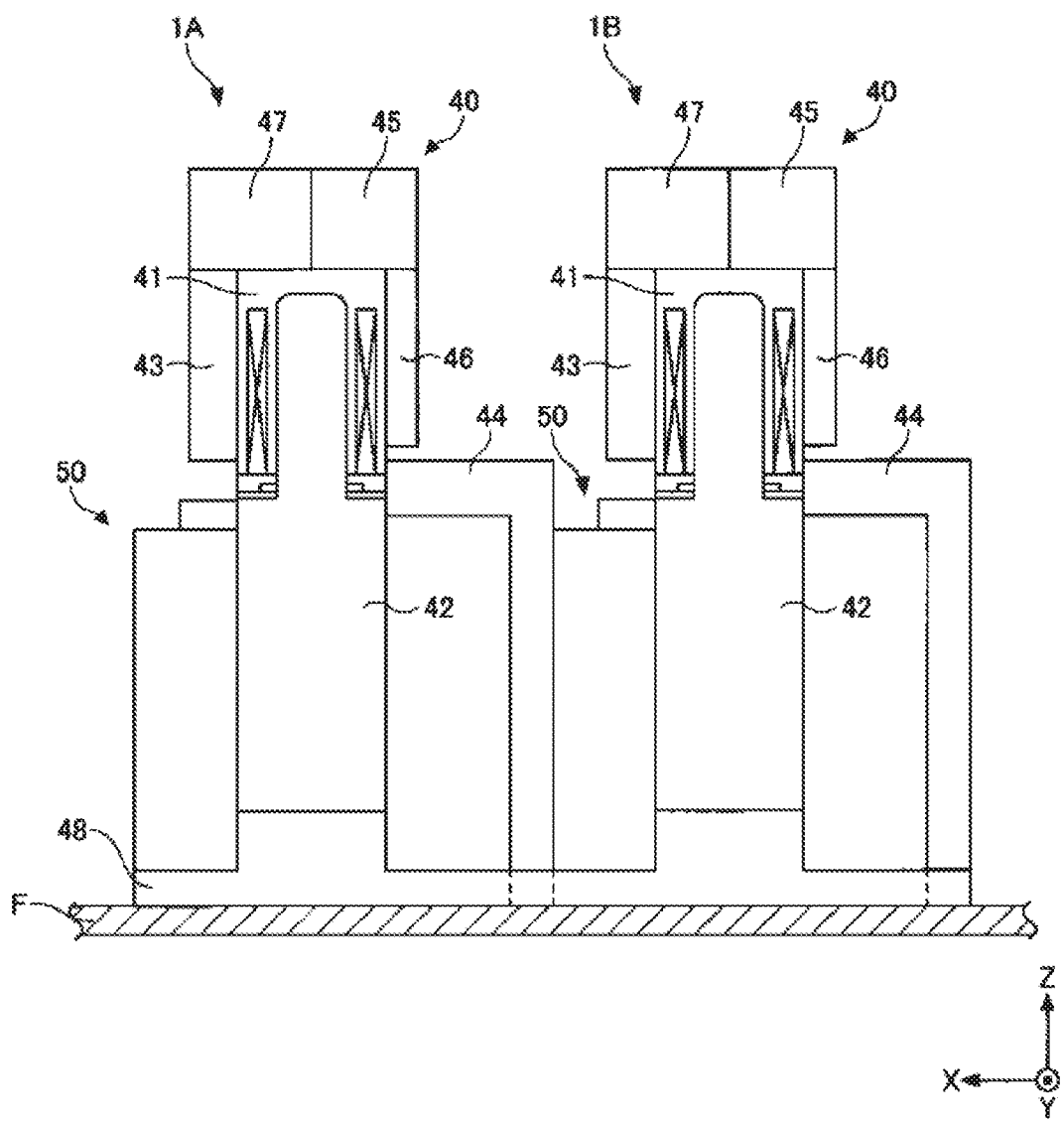
FIG. 5 is a view illustrating another example of a configuration of the processing apparatus according to the first embodiment of the present disclosure.

In the above-described embodiment, the case in which a single processing apparatus is provided has been described. However, a plurality of processing apparatuses may be provided adjacent to one another. FIG. 5 is a view illustrating another example of a configuration of the processing apparatus according to the first embodiment. In the example of FIG. 5, two processing apparatuses 1A and 1B are provided adjacent to each other in the left-right direction. The two processing apparatuses 1A and 1B may have the same configuration as that of the processing apparatus 1 described above.

Second Embodiment

Figure 6:
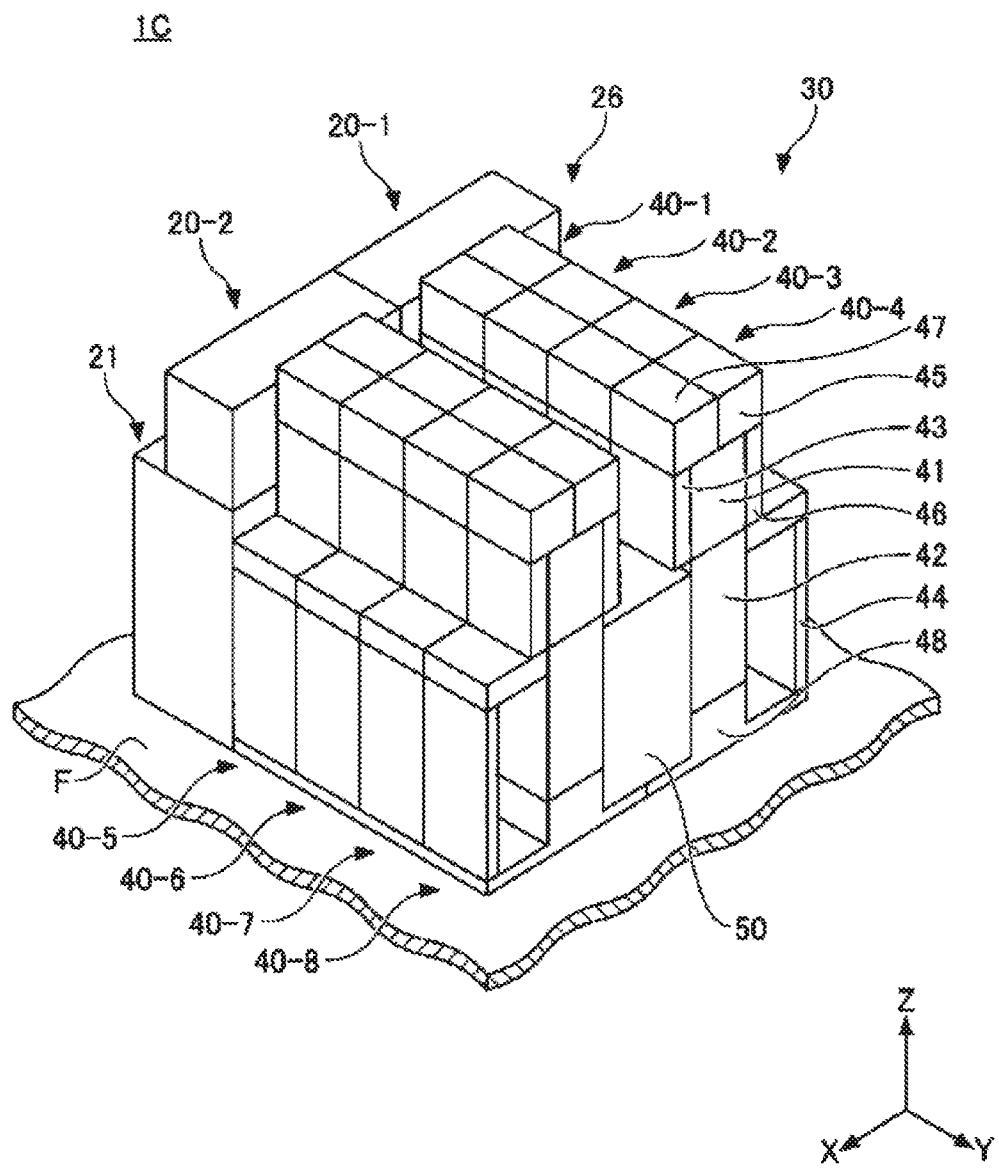
FIG. 6 is a perspective view illustrating an example of a configuration of a processing apparatus according to a second embodiment of the present disclosure.

A processing apparatus according to a second embodiment will be described. FIG. 6 is a perspective view illustrating an example of a configuration of a processing apparatus according to the second embodiment.

As illustrated in FIG. 6, a processing apparatus 1C of the second embodiment differs from the processing apparatus 1 of the first embodiment in that a plurality of process modules 40-1 to 40-8 are arranged on both sides (+X direction side and −X direction side in FIG. 6) with respect to the wafer transfer module 50. Hereinafter, a description will be given focusing on differences from the first embodiment.

The processing apparatus 1C includes loader modules 20-1 and 20-2 and a processing module 30.

Each of the loader modules 20-1 and 20-2 may have the same configuration as that of the loader module 20 of the first embodiment. In addition, only one of the loader modules 20-1 and 20-2 may be provided. That is, the processing apparatus 1C may have one or more loader modules 20.

The processing module 30 takes out wafers W from carriers C in the loader modules 20-1 and 20-2 and performs various processes on the wafers W. In order to prevent an oxide film from being formed on the wafers W, the interior of the processing module 30 is under an inert gas atmosphere, for example, a nitrogen gas atmosphere. The processing module 30 includes eight process modules 40-1 to 40-8 and one wafer transfer module 50.

The process modules 40-1 to 40-4 are disposed at one side of the wafer transfer module 50 (the −X direction side in FIG. 6). The process modules 40-1 to 40-4 are concatenated with one another in the front-rear direction (the Y direction in FIG. 6) in this order from a side of the loader module 20-1. Similarly to the process module 40, each of the process modules 40-1 to 40-4 includes a heat treatment unit 41, a load unit 42, a gas supply unit 43, an exhaust duct 44, an RCU 45, a branch duct 46, a control unit 47, and a floor box 48.

The process modules 40-5 to 40-8 are disposed at the other side of the wafer transfer module 50 (the +X direction side in FIG. 6). The process modules 40-5 to 40-8 are concatenated with one another in the front-rear direction (the Y direction in FIG. 6) in this order from a side of the loader module 20-2. Similarly to the process module 40, each of the process modules 40-5 to 40-8 includes a heat treatment unit 41, a load unit 42, a gas supply unit 43, an exhaust duct 44, an RCU 45, a branch duct 46, a control unit 47, and a floor box 48.

The process modules 40-1 to 40-4 and the process modules 40-5 to 40-8 face each other with the wafer transfer module 50 interposed therebetween. That is, the gas supply units 43 included in the process modules 40-1 to 40-4 are disposed on side surfaces of the heat treatment units 41 facing the process modules 40-5 to 40-8. The gas supply units 43 included in the process modules 40-5 to 40-8 are disposed on side surfaces of the heat treatment units 41 facing the process modules 40-1 to 40-4.

The wafer transfer module 50 is an example of a substrate transfer module, and one wafer transfer module 50 is provided commonly for eight process modules 40-1 to 40-8. In other words, the eight process modules 40 have a common wafer transfer module 50. The wafer transfer module 50 is disposed between the process modules 40-1 to 40-4 and the process modules 40-5 to 40-8, and is installed on the floor F via the floor box 48. A wafer transfer mechanism 51 (see FIG. 4), which is an example of a substrate transfer mechanism, is provided in the wafer transfer module 50. The wafer transfer mechanism 51 delivers the wafers W between the interior of the carriers C placed on the FIMS ports and wafer boats 414 placed on the load units 42 of the process modules 40-1 to 40-8. The wafer transfer mechanism 51 has, for example, a plurality of forks to simultaneously transfer the plurality of wafers W. Thus, it possible to shorten a time required to transfer the wafers W. Alternatively, the wafer transfer mechanism 51 may have one fork.

According to the processing apparatus 1C of the second embodiment, four process modules 40-1 to 40-4 are concatenated with one another with respect to the loader module 20-1, and four process modules 40-5 to 40-8 are concatenated with one another with respect to the loader module 20-2. Each of the plurality of process modules 40-1 to 40-8 includes the heat treatment unit 41 having the processing container 412 configured to accommodate and process a plurality of wafers W, and the gas supply unit 43 disposed on one side surface of the heat treatment unit 41 and configured to supply a gas into the processing container 412. Thus, it possible to reduce a footprint of the processing apparatus 1C having the plurality of process modules 40-1 to 40-8.

When it is necessary to reduce a lot size, for example, when it is required for one process module to process about 25 sheets of wafers, it is desirable to increase the number of process modules provided in the processing apparatus so as to maintain a productivity of the processing apparatus. With an increase of the number of process modules, the installation area increases when all of the process modules are concatenated with one another in the front-rear direction (the Y direction in FIG. 6).

Therefore, according to the processing apparatus 1C of the second embodiment, a plurality of process modules is concatenated with one another in the front-rear direction at both sides of the wafer transfer module 50, respectively. Thus, since the installation area of the wafer transfer module 50 is not increased, it may be possible to reduce the footprint compared to the case in which all of the process modules are concatenated with one another in the front-rear direction.

Figure 7:
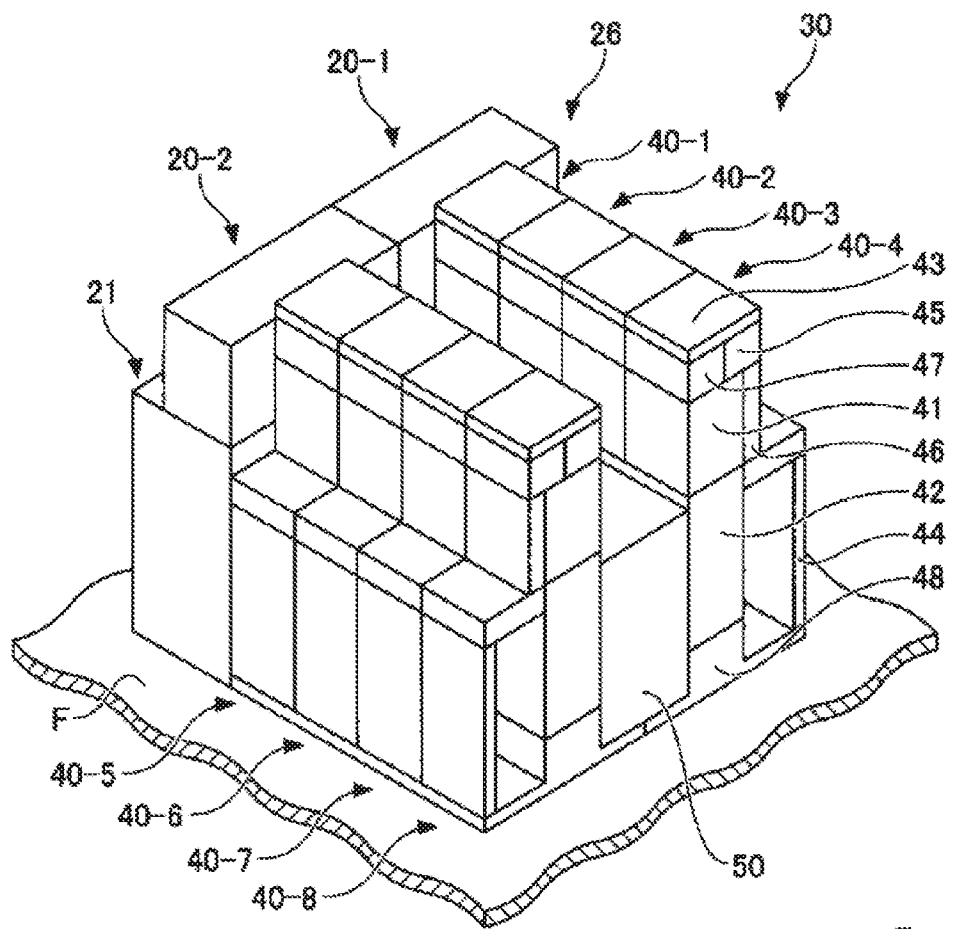
FIG. 7 is a perspective view illustrating another example of a configuration of the processing apparatus according to the second embodiment of the present disclosure.

Next, a modification of the processing apparatus according to the second embodiment will be described. FIG. 7 is a perspective view illustrating another example of a configuration of the processing apparatus of the second embodiment.

A processing apparatus 1D illustrated in FIG. 7 differs from the processing apparatus 1C illustrated in FIG. 6 in that the gas supply unit 43 is disposed above the heat treatment unit 41, for example, on top surfaces of the RCU 45 and the control unit 47. Other features of the processing apparatus 1D may be the same as those of the processing apparatus 1C.

According to the processing apparatus 1D illustrated in FIG. 7, since the gas supply unit 43 is disposed above the heat treatment unit 41, the side surface of the heat treatment unit 41 may be used as an area through which only a gas pipe passes. Thus, it is possible to secure a space for maintenance at a lateral side of the heat treatment unit 41 and above the wafer transfer module 50. Therefore, it is possible to achieve both maintainability and space savings.

In the above-described embodiments, the case in which four process modules 40 are concatenated with one another has been described, but the number of process modules 40 is not limited thereto. For example, two or three process modules 40 may be concatenated with one another, or five or more process modules 40 may be concatenated with one another.

According to the present disclosure, it is possible to reduce a footprint of a processing apparatus having a plurality of process modules.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A processing apparatus comprising:
   a plurality of process modules concatenated with one another;
   at least one loader module configured to receive a carrier accommodating a plurality of substrates to be processed by the plurality of process modules; and
   a substrate transfer module that includes a substrate transfer mechanism configured to deliver the plurality of substrates between the at least one loader module and a load unit provided in each of the plurality of process modules and configured to accommodate a substrate holder,
   wherein each of the plurality of process modules comprises:
      a heat treatment unit including a processing container configured to accommodate the plurality of substrates and perform a heat treatment on the plurality of substrates; and
      a gas supply unit disposed on an external side wall of the heat treatment unit and configured to supply a gas into the processing container, and
   wherein the plurality of process modules is concatenated with one another in one direction at both sides of the substrate transfer module.

2. The processing apparatus of claim 1, wherein the gas supply unit is spaced apart from a floor.

3. The processing apparatus of claim 2, wherein the heat treatment unit includes a gas introduction port disposed at a side of the gas supply unit and configured to introduce the gas into the processing container.

4. The processing apparatus of claim 3, wherein each of the plurality of process modules includes an exhaust duct facing the gas supply unit with the heat treatment unit interposed between the gas supply unit and the exhaust duct, and including an exhaust pipe configured to exhaust the gas in the processing container.

5. The processing apparatus of claim 4, wherein the heat treatment unit includes an exhaust port disposed at a side of the exhaust duct and configured to exhaust the gas in the processing container.

6. The processing apparatus of claim 5, wherein the load unit provided in each of the plurality of process modules is disposed below the heat treatment unit.

7. The processing apparatus of claim 6, wherein the gas supply unit overlaps with the substrate transfer module in a plan view.

8. The processing apparatus of claim 1, wherein the heat treatment unit includes a gas introduction port disposed at a side of the gas supply unit and configured to introduce the gas into the processing container.

9. The processing apparatus of claim 1, wherein each of the plurality of process modules includes an exhaust duct facing the gas supply unit with the heat treatment unit interposed between the gas supply unit and the exhaust duct, and including an exhaust pipe configured to exhaust the gas in the processing container.

10. The processing apparatus of claim 1, wherein the load unit provided in each of the plurality of process modules is disposed below the heat treatment unit.

* * * * *